United States Patent
Ostrom et al.

(10) Patent No.: US 7,481,072 B2
(45) Date of Patent: Jan. 27, 2009

(54) ARRANGEMENTS FOR AND METHODS OF PHASE CHANGE COOLING OF POWER ELECTRONICS

(75) Inventors: Eric R. Ostrom, Bellflower, CA (US); Karl D. Conroy, Huntington Beach, CA (US); George John, Cerritos, CA (US); Gregory S. Smith, Woodland Hills, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 251 days.

(21) Appl. No.: 11/374,677

(22) Filed: Mar. 14, 2006

(65) Prior Publication Data

US 2006/0174643 A1      Aug. 10, 2006

Related U.S. Application Data

(63) Continuation-in-part of application No. 11/054,483, filed on Feb. 9, 2005, now Pat. No. 7,210,304.

(51) Int. Cl.
*B60H 1/32* (2006.01)

(52) U.S. Cl. .................................. 62/243; 62/259.2

(58) Field of Classification Search ............... 62/259.2, 62/310, 242, 239, 119, 243
See application file for complete search history.

(56) References Cited

U.S. PATENT DOCUMENTS

| 6,278,179 | B1 * | 8/2001 | Mermet-Guyennet | 257/686 |
| 6,772,603 | B2 * | 8/2004 | Hsu et al. | 62/259.2 |
| 2006/0174643 | A1 | 8/2006 | Ostrom et al. | 62/259.2 |

\* cited by examiner

*Primary Examiner*—Melvin Jones

(57) ABSTRACT

Power electronics for electric traction motors used to drive automotive vehicles are cooled in a closed system by spraying a dielectric liquid coolant directly onto inverter circuitry. The liquid coolant changes phase and vaporizes as it absorbs heat from power transistors in inverter circuitry comprising the power electronics. The resultant vapor is condensed back to a liquid in a heat exchange arrangement having pipes carrying a second coolant from a radiator used to cool an engine or fuel cell stack in the automotive vehicle. Overspray coolant, which remains liquid, can also be cooled by the heat exchange arrangement. By utilizing the latent heat of evaporation of the dielectric coolant and increasing the rate recycling of the coolant as power output increases, temperature increases in the power electronics are controlled.

12 Claims, 5 Drawing Sheets

US 7,481,072 B2

ARRANGEMENTS FOR AND METHODS OF PHASE CHANGE COOLING OF POWER ELECTRONICS

RELATED PATENT APPLICATIONS

This application is a continuation in part of U.S. patent application Ser. No. 11/054,483, filed Feb. 9, 2005 now U.S. Pat. No. 7,210,304 having the title, "Cooling Arrangements For Integrated Electric Motor Inverters."

FIELD OF THE INVENTION

The present invention is directed to arrangements for and methods of phase change cooling of power electronics. More particularly, the present invention is related to such arrangements and methods for cooling power electronics which include inverter circuitry, wherein the inverter circuitry provides current to traction motors used to drive electric vehicles such as, but not limited to, battery powered vehicles, gas-electric hybrid vehicles and fuel cell powered electric vehicles.

BACKGROUND OF THE INVENTION

Vehicles which utilize electric traction motors to drive wheels of a vehicle, whether the electric motor is in a gas-electric hybrid vehicle or a fuel cell powered vehicle, typically use a three-phase AC motor coupled with inverter circuitry that converts direct current from a power source to alternating current. Currently, inverter circuitry generally comprises power transistors mounted on a DBC (direct bonded copper) substrate with integrated bus bars.

As automotive vehicles start, change cruising speeds, accelerate and brake, power demands of electric traction motors driving the vehicles fluctuate over a wide range. Fluctuations in power demand cause temperature changes in power electronics connected to the traction motors. The power electronics include inverter circuitry comprised of different materials with various coefficients of expansion. Accordingly, heat fluctuations can degrade inverter circuitry as the integrated components thereof expand at different rates tending to shift slightly with respect to one another as the components respond to temperature variations. It is necessary to control temperature to keep expansions and contractions of the components within acceptable levels. Currently, this is accomplished by circulating fluids through heat sinks associated with the DBC or by flowing air thereover to absorb and carry away heat. While these approaches currently appear satisfactory, there remains a need to more precisely control the temperature of inverter circuitry over the life of vehicles utilizing traction electric motors in order to sustain reliability, as well as to control power consumption.

SUMMARY OF THE INVENTION

In view of the aforementioned considerations, a cooling arrangement is provided for cooling components of power electronics connected to deliver current to an electric traction motor for driving at least one traction wheel of an automotive vehicle. The arrangement comprises a housing having compartment with a space containing the components. The compartment has an inlet opening and an outlet opening for cooling fluid communicating with the space. The cooling fluid is a non-corrosive dielectric cooling fluid which is dispensed in liquid phase into the space and onto the components of the inverter circuitry by a pump provided for recycling the dielectric coolant from a reservoir that collects the dielectric coolant from the components. The dielectric fluid has a phase change point selected to absorb a substantial quantity of heat at the boiling temperature of the coolant before the coolant vaporizes. The reservoir uses a second coolant in a liquid-fluid heat exchanger to condense the recycling fluid prior to reapplying the recycled fluid in liquid phase onto the power electronics components.

In a further aspect of the cooling arrangement the dielectric cooling fluid has a boiling point in a range of 90° C. to 120° C.

In a further aspect of the cooling arrangement, the dielectric cooling fluid has a boiling point below 100° C.

In a further aspect of the cooling arrangement, the dielectric cooling fluid has a boiling point of about 98° C.

In a further aspect of the cooling arrangement, the dielectric coolant fluid is a mixture of polypropylene glycol methyl ether and hexamethyldisiloxane.

In a further aspect, a method for cooling power electronics is provided in which heat is absorbed fro power electronics used to drive vehicles by recirculating coolant fluid which has changed phase upon absorbing heat from the power electronics; is condensed and resprayed as a liquid onto the power electronics.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views, and wherein.

DETAILED DESCRIPTION

Figure 1:
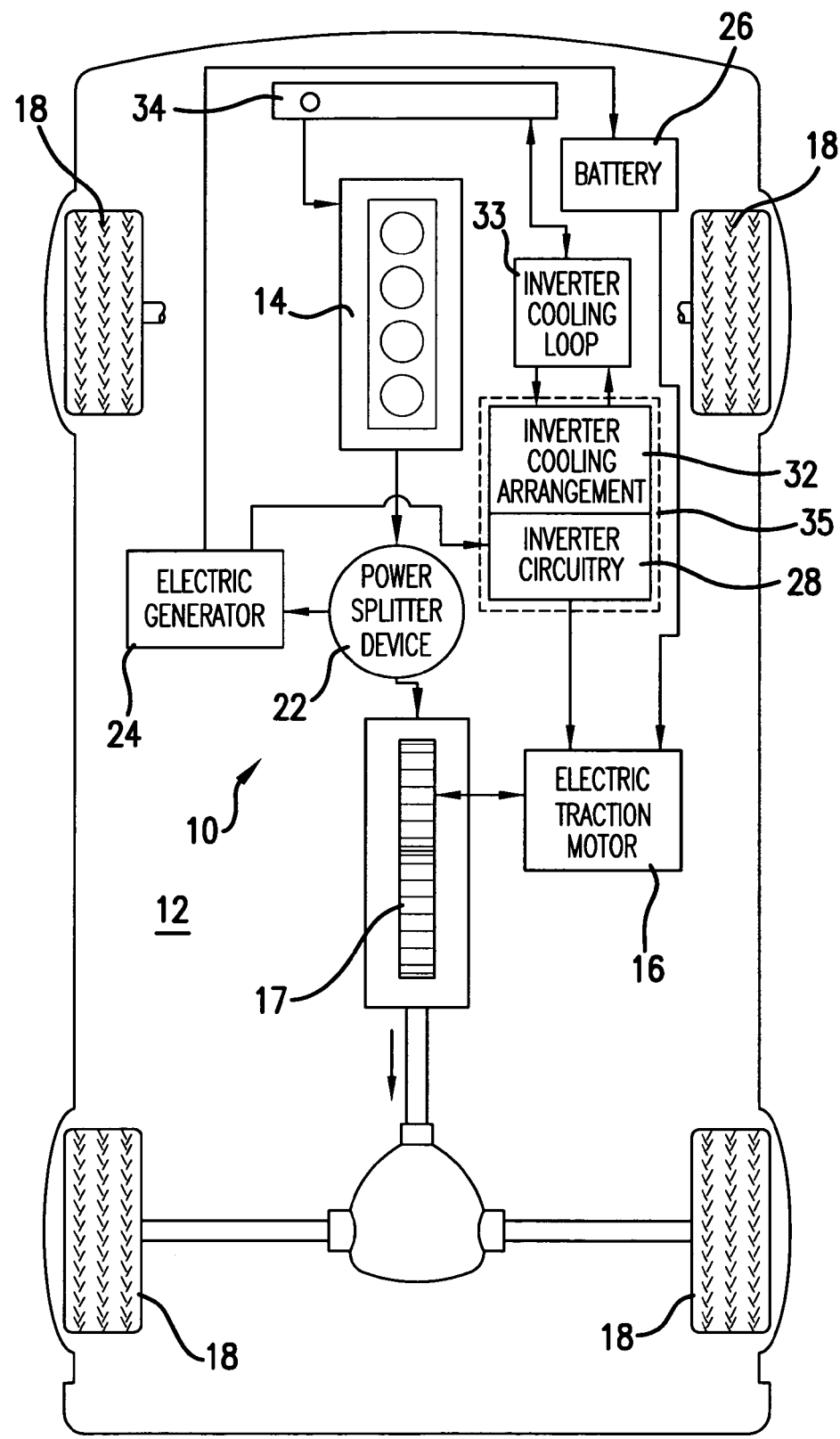
FIG. 1 is a schematic view of an automotive vehicle having a gas-electric hybrid drive.

Referring now to FIG. 1, there is shown an example of a gas-electric drive 10 for powering a vehicle 12 utilizing an internal combustion engine 14 and a three-phase electric traction motor 16 to drive, through a transmission 17, wheels 18 of the vehicle. A power splitter 22 determines whether the internal combustion engine 14 or the electric motor 16 drives the transmission 17, or whether the transmission or internal combustion engine drives an electric generator 24. In an alternative embodiment (not shown), the generator 24 is mounted next to the electric traction motor 16 and cooled with the same arrangement as the traction motor. The electric generator 24 charges a battery 26 and/or provides direct current to inverter circuitry 28 that provides alternating current for the electric traction motor 16. Since the inverter circuitry 28 generates heat, the inverter circuitry requires a cooling arrangement 32. In accordance with one aspect of the present invention, the cooling arrangement 32 is connected to a sealed cooling loop 33 which is coupled thermally to a radiator 34 which cools the internal combustion engine 14. The cooling arrangement 32 has at least a portion that is integral with the inverter circuitry 28 to form a module 35.

Figure 2:
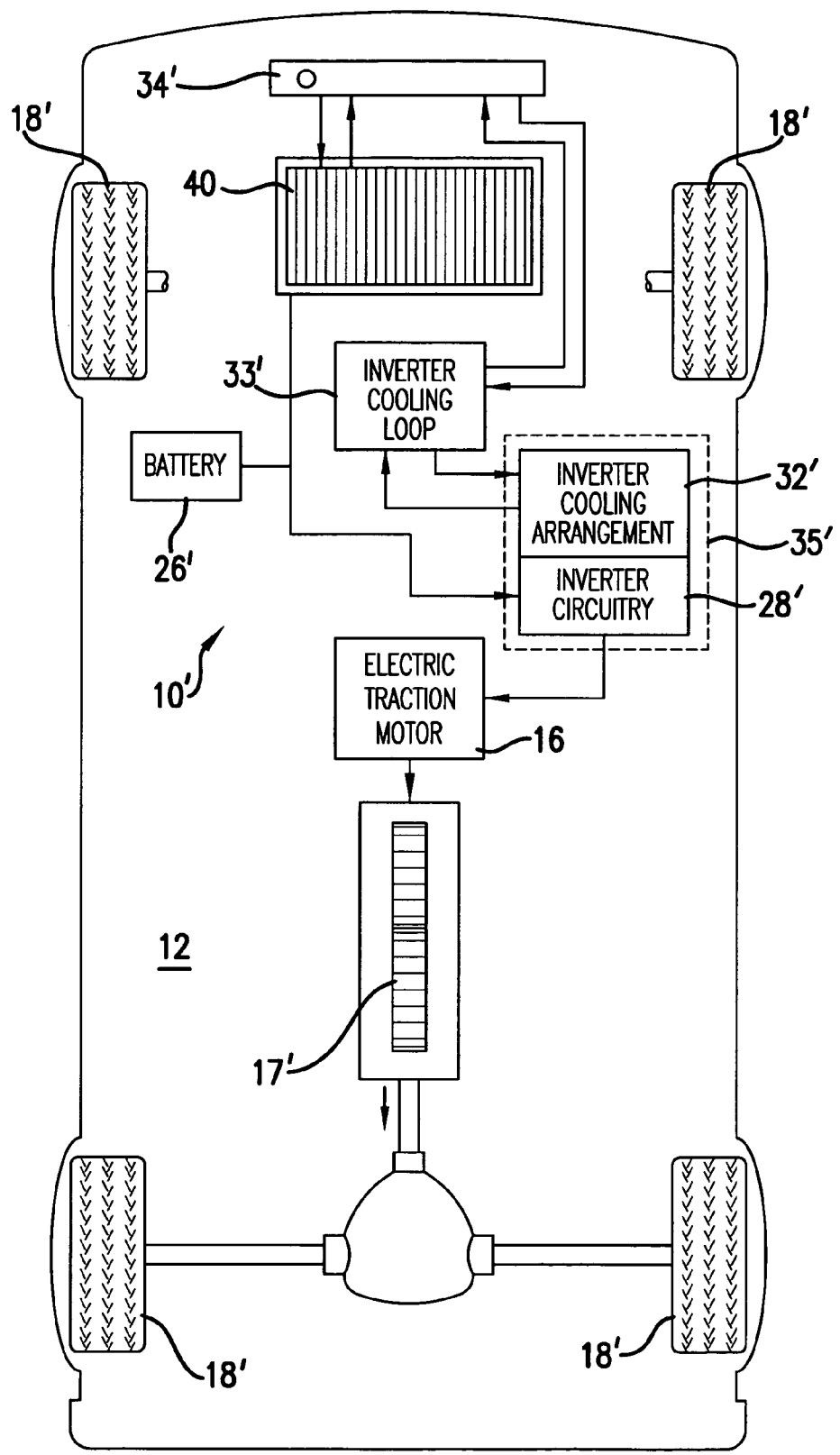
FIG. 2 is a schematic view of an automotive vehicle that uses fuel cell power to drive an electric traction motor.

Referring now to FIG. 2, a fuel cell drive system 10' utilizes a fuel cell 40 to power a three-phase electric traction motor 16 which drives the wheels 18 through a transmission 17'. The fuel cell 40 is connected either directly or through a battery pack 26' to supply direct current to inverter circuitry 28' which converts direct current to alternating current for the three-phase electric motor 16. As with the gas-electric hybrid of FIG. 1, the inverter circuitry 28' has a cooling arrangement 32' that is coupled thermally by a cooling loop 33' to a radiator 34' used to cool the fuel cell 40. As with the first embodiment of FIG. 1, in the second embodiment of FIG. 2 the cooling arrangement 32' at least in part is integral with the inverter circuitry 28'.

Figure 3:
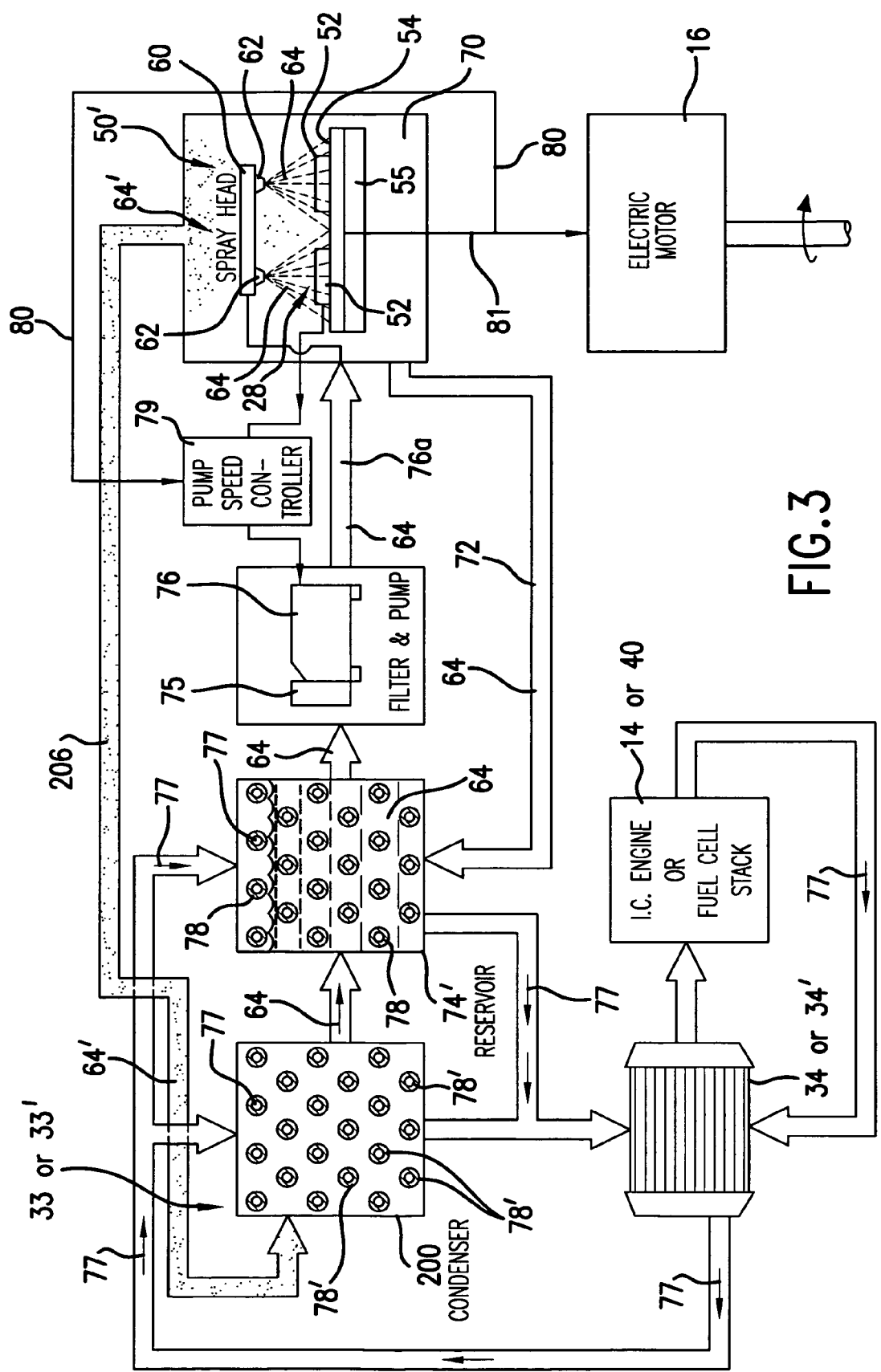
FIG. 3 is a schematic diagram of a heat exchanger loop for cooling and condensing power electronics coolant fluid utilized with the vehicles of FIGS. 1 and 2.

Referring now to FIG. 3, the inverter cooling arrangements 32 or 32' shown in FIGS. 1 and 2, respectively, are usable with either the gas-electric hybrid drive 10 or the fuel cell drive 10'. The gas-electric hybrid drive 10 and the fuel cell drive 10' are merely exemplarily of various configurations for such drives. For example, the gas-electric hybrid drive 10 can be configured as a parallel arrangement, a series arrangement or any other effective arrangement, as can the fuel cell drive 10'. The gas-electric hybrid drive 10 may use a gasoline engine, a diesel engine, a turbine engine or any other engine configuration.

By using a coolant dispenser 60, liquid coolant 64 is applied directly to the source of heat in the power electronics; i.e., the power transistors 52 that convert direct current to alternating current. Cooling allows the power density (power per unit volume) of the inverter circuitry 28 to be increased. To be cooled by the liquid coolant 64, heat generated by the power transistors 52 need not travel through multiple layers of materials, a few of which materials have low thermal conductivity. Rather, a direct thermal path that is provided by spray cooling reduces the temperature of the power transistors 52. With a lower temperature for the power transistors 52, increased power is available through the inverter circuitry 28 to the three-phase traction motor 16. Alternatively, with improved cooling, smaller inverter circuitry 28 may be utilized, producing substantially the same available power to the traction motor 16, while consuming less space.

The spray cooling provided by the spray nozzles 62 is also usable on other components associated with the inverter circuitry 28, such as capacitors, transformers and integrated circuits that are temperature sensitive. Moreover, the spray cooling provides cooling to wire bonds between the elements of the inverter circuitry 28 and prevents wire bonds from overheating, thus minimize failure. Accordingly, along with the resulting reduction of component temperatures, improved reliability is provided.

Because spray cooling provides increased cooling capacity, spray cooling improves resistance of the inverter circuitry 28 to transient power fluctuations. Transient power fluctuations exist on the input to the inverter circuitry 28 due to sudden increases in power demanded by the vehicle 12 (FIGS. 1 and 2) for short periods of time. The fluctuations can be caused by increased resistance to the output of the motor 16 that in turn cause temperature increases in the power transistors 52. By having direct application of the cooling media 64 to the power transistors 52, temperature change is reduced in both time duration and temperature increase.

In order that the coolant 64 does not electrically interact with or degrade the components of the inverter circuitry 28, the coolant is a dielectric coolant, preferably having a boiling point in the range of about 90° C. to 120° C. A suggested coolant is a mixture of methylsiloxane and an organic compound such as polypropylene glycol methyl ether, wherein the coolant has minimal instability and reactivity. An example of such a liquid is OS-120 available from Dow Corning Corporation, which is a mixture of hexmethyidisiloxane and propylene glycol methyl ether, the hexmethyidisiloxane having a percentage by weight greater than 60% and the propyleneglycol methyl ether having a percentage by weight in a range of 10% to 30%. OS-120 has a boiling point of about 98° C. and is a dielectric material that does not degrade when used to cool interconnected electrical components. The dielectric liquid coolant 64 continues to absorb heat at about 98° C. without changing phase to its vapor form 64' until the heat capacity of the coolant reaches its boiling point, at which time the liquid coolant vaporizes to carry away heat generated by the power transistors 52 and emanating from other components of the power electronics package. Other dielectric coolants, which have minimal instability and minimal reactivity with the electrical components of the inverter, may be used as alternatives to OS-120.

Still referring mainly to FIG. 3, the coolant 64 is sprayed as a liquid and is collected in a sump portion 70 of the compartment 50 and through a spray return 72 is returned to a reservoir 74 which is connected through a filter 75 to a pump 76. The pump 76 is connected to the liquid dispenser 60 by line 76a that supplies recycled liquid coolant 64 to the spray nozzles 62 for continued cooling of the inverter circuitry 28. While the liquid coolant 64 is circulating through the reservoir 74, it is cooled by the inverter cooling loop 33 or 33' (see also FIGS. 1 and 2) with a second liquid coolant 77. An example of the second liquid coolant 77 is a water ethylene glycol solution. The second coolant 77 flows through tubes 78 in the reservoir 74 and is supplied by the radiator 34, which cools the internal combustion engine 14 of FIG. 1 or is supplied by the radiator 34', which cools the fuel cell stack 40 of FIG. 2.

The cooling arrangement of FIG. 3 takes advantage of the latent heat of vaporization of coolant 64. When the liquid coolant 64 is sprayed onto power electronics components that operate at temperatures hotter than the vaporization (i.e., boiling) temperature of the coolant, the coolant changes phase from the liquid coolant 64 to a vaporized coolant 64'. The vaporized coolant 64'carries waste heat away from the inverter circuitry 28 (or 28') as the vaporized coolant disperses into the chamber 50'. The coolant loop 33 or 33' includes a condenser 200 which is separate from the reservoir 74', as well as a separate passage 206 for conveying vaporized coolant 64' from the compartment 50' to the condenser 200. A second coolant flow 77 from the vehicle radiator 34 or 34'is circulated through the coolant pipes 78' to change the phase of the coolant from a vapor 64' back to coolant liquid 64. The liquid 64 from the condenser 200 mixes with the liquid in the reservoir 74' and is filtered by a filter 75 prior to being pumped by the pump 76 over line 76a back to the fluid dispenser 60, where the coolant 64 is sprayed in liquid form onto the power inverter circuitry 28.

The pump 76 is preferably a variable output pump which is controlled by a controller 79 that is activated by an output current signal over line 80 from the output line 81 from the power transistors 52 to the three-phase electric motor 16. The controller 79 increases the pumping rate of pump 75 as the output of the power transistors 52 increases. By providing variable spray cooling, temperature control under all operating conditions is achieved. Such an arrangement increases component reliability by minimizing temperature changes so that the inverter circuitry 28 operates under substantially isothermal conditions. By consistently controlling the amount of dielectric liquid coolant 64 sprayed through the atomizer nozzles 62, sufficient liquid mist is provided at maximum power dissipation conditions. The liquid mist 64 exhibits a phase change converting to a vapor 64' after being sprayed on the inverter circuitry 28. When the phase change occurs, the power transistors 52 remain at substantially constant temperature regardless of increased power output and increased power dissipation. By varying the flow of the liquid coolant 64 with respect to actual component power dissipation, the phase change region of the fluid comprising the liquid coolant 64 is utilized so that the coolant accommodates all operating conditions.

Alternatively, the temperature of the transistors 52 may be monitored with a thermocouple arrangement with the speed of the pump 76 being increased as the temperature of the transistors increases to spray more liquid coolant and thereby decrease the temperature of the transistors.

Figure 4:
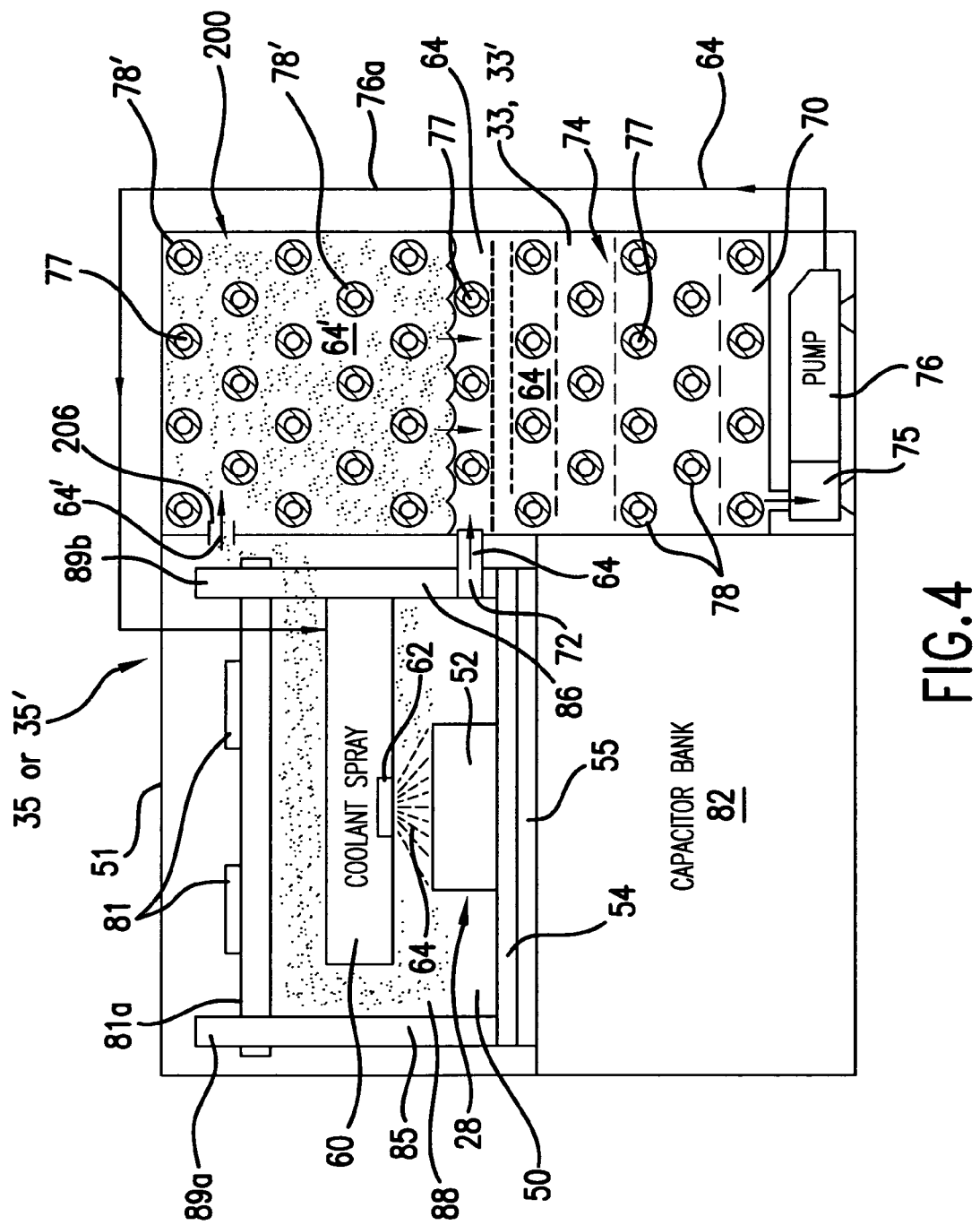
FIG. 4 is a front view of a spray cooled inverter circuit configured in accordance with the second embodiment of the present invention shown in FIG. 3.

Referring now more specifically to FIG. 4 in conjunction with FIG. 3, the spray cooling arrangement of FIG. 3 is configured as a module 35 or 35' exemplified in FIG. 4. Vapor 64' is pulled through passage 206 by negative pressure of the pump 76 and into the condenser 200. In the arrangement of FIG. 4, the condenser 200 is disposed above the reservoir 74 so that the liquid coolant 64, condensed from the coolant vapor 64', flows down and mixes with overspray coolant liquid 64 which has entered the reservoir via passageway 72. All of the cooled and condensed coolant is then pulled through the filter 75 and into the pump 76; recycled by the pump, and then sprayed as a liquid mist or liquid droplets 64 through the nozzles 62 onto the inverter circuitry 28. The liquid mist or droplets 64 form a liquid layer on the inverter circuitry 28, and as previously described, the liquid layer absorbs heat and at least a portion of the liquid vaporizes into vapor 64'. The vapor 64' is then pulled through the passageway 206 into the condenser 200 by the pump 76 and mixed with cooling liquid coolant 64 in the reservoir 74 to continue the cooling cycle.

Figure 5:
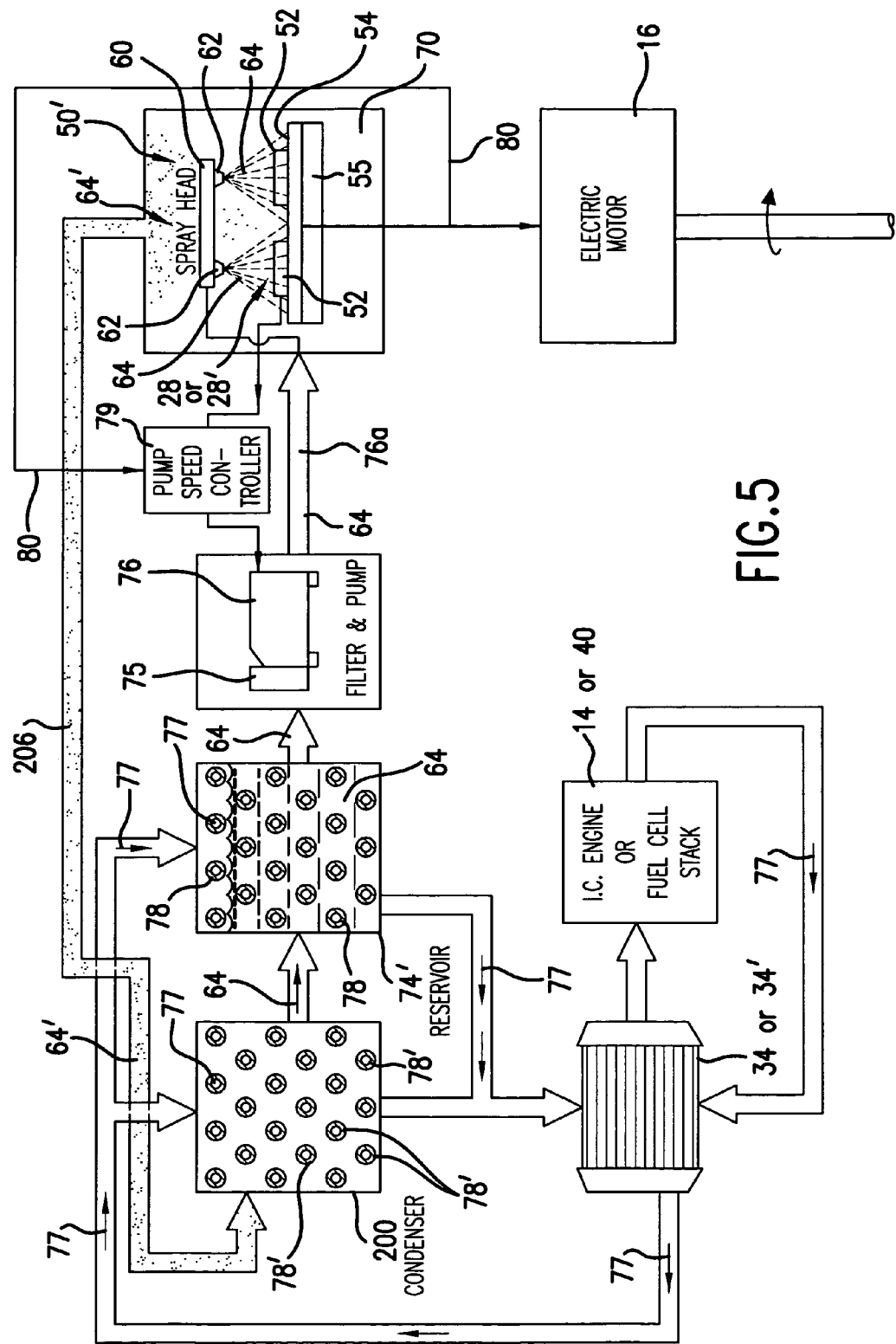
FIG. 5 is a schematic diagram of another embodiment of a heat exchanger loop for cooling and condensing vaporized coolant used to cool power electronics utilized in the vehicles of FIGS. 1 and 2.

Referring now to FIG. 5, a second embodiment of the invention is shown where only the vaporized coolant 64' is recycled, the line 72 of FIG. 3 having been deleted. With this arrangement, the temperature of the power electronics 28 is substantially controlled by the heat of vaporization of the liquid coolant 64, which in the case of the aforedescribed OS-120 is less than 100° C.

From the foregoing description, one skilled in the art can easily ascertain the essential characteristics of this invention, and without departing from the spirit and scope thereof, can make various changes and modifications of the invention to adapt it to various usages and conditions.

We claim:

1. A cooling arrangement for cooling an inverter circuit which provides current to an electric traction motor for driving at least one traction wheel of an automotive vehicle, the arrangement comprising:
    a housing compartment with a space containing the components of the inverter circuit;
    a fresh coolant fluid inlet opening and a used coolant fluid outlet opening communicating with the space containing the components of the inverter circuit;
    a dielectric liquid coolant;
    a cooling fluid dispenser for spraying the dielectric liquid coolant while in a liquid phase into the space and onto the components of the inverter circuit;
    a reservoir for collecting overspray of the dielectric fluid which has remained in the liquid phase after spraying onto the inverter circuit, the reservoir cooling the liquid for subsequent recycling over power electronics;
    a condenser for liquefying dielectric coolant which has converted from the liquid phase to a vapor phase upon absorbing sufficient heat from the components of the inverter circuit to change phase; and
    a pump for cycling the dielectric coolant while primarily in the liquid phase from the reservoir and the condenser to the cooling fluid dispenser for cooling the components of the inverter circuit.

2. The cooling arrangement of claim 1 further including a control for monitoring the cooling requirement of the components, the control being connected to the pump to power the pump in accordance with the cooling requirements of the components.

3. The cooling arrangement of claim 1 wherein the dielectric coolant fluid is a mixture of propylene glycol methyl ether and hexamethyldisiloxane.

4. The cooling arrangement of claim 1 wherein the reservoir, condenser filter and pump are disposed proximate one another to provide a module.

5. The cooling arrangement of claim 2 wherein the control is connected to the power output of the power electronics and increases the coolant output of the pump in response to increased power output of the power electronics to dispense and recirculate dielectric coolant fluid at a faster rate to absorb additional heat generated by additional power output.

6. A method of cooling power electronics providing current to an electric traction motor driving at least one traction wheel of an automotive vehicle, the method comprising:
    spraying the power electronics with a dielectric liquid coolant having a latent heat of vaporization sufficient to continue removal of heat from the power electronics while the dielectric liquid coolant remains at a constant temperature and before the dielectric liquid changes phase and becomes a vapor;
    condensing the vapor into a liquid, and recirculating the liquid onto the power electronics for subsequent vaporization to continuously cool the power electronics and maintain temperature of the power electronics below a selected level.

7. The method of claim 6 further including monitoring the power output of the power electronics and increasing the rate of recirculation of coolant liquid as the power output rises.

8. The method of claim 6 wherein the dielectric coolant is a mixture of propylene glycol methyl ether and hexamethyldisiloxane.

9. The method of claim 8 wherein the constant temperature is no greater than 100° C.

10. The method of claim 6 wherein the constant temperature occurs in a range of about 90° C. to about 120° C.

11. The method of claim 10 wherein the constant temperature is no greater than 100° C.

12. A cooling arrangement for cooling an inverter circuit which provides current to an electric traction motor for driving at least one traction wheel of an automotive vehicle, the cooling arrangement comprising:
    a housing compartment with a space containing components of the inverter circuit;
    a dielectric coolant;
    a cooling fluid dispenser for spraying the dielectric coolant while in the liquid phase into the space containing components of the inverter circuit and onto the components of the inverter circuit;
    a reservoir for collecting overspray of the dielectric coolant which has remained in the liquid phase after spraying onto the inverter circuit, the reservoir cooling the dielectric coolant for subsequent recycling over the inverter circuit;

a condenser for liquefying dielectric coolant which has converted from the liquid phase to a vapor phase upon absorbing sufficient heat from the components of the inverter circuit to change phase;

a pump for cycling the dielectric coolant while primarily in the liquid phase from the reservoir and the condenser to the cooling fluid dispenser for cooling the components of the inverter circuit; and a control for monitoring a cooling requirement of the components, the control being connected to the pump to power the pump in accordance with the cooling requirement of the components, wherein the control is connected to a power output of the inverter circuit and increases the dielectric coolant output of the pump in response to increased power output of the inverter circuit to dispense and recirculate the dielectric coolant at a faster rate to absorb additional heat generated by additional power output.

* * * * *

UNITED STATES PATENT AND TRADEMARK OFFICE
CERTIFICATE OF CORRECTION

PATENT NO. : 7,481,072 B2
APPLICATION NO. : 11/374677
DATED : January 27, 2009
INVENTOR(S) : Ostrom et al.

It is certified that error appears in the above-identified patent and that said Letters Patent is hereby corrected as shown below:

Title page, item (75), Inventors: Add --Bruce A. Smetana--.

Signed and Sealed this

Twenty-first Day of September, 2010

David J. Kappos
*Director of the United States Patent and Trademark Office*